United States Patent
Miller et al.

(10) Patent No.: US 7,035,780 B2
(45) Date of Patent: Apr. 25, 2006

(54) METHODS OF AND APPARATUS FOR ROUTING RANKED CRITICAL CONDUCTORS IN RANKED PREFERRED TRACKS

(75) Inventors: Kristian Miller, Palo Alto, CA (US); Joseph Ferguson, Palo Alto, CA (US); Robert Walsh, Palo Alto, CA (US); Olivia Wu, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 624 days.

(21) Appl. No.: 10/027,876

(22) Filed: Dec. 21, 2001

(65) Prior Publication Data
US 2002/0046390 A1 Apr. 18, 2002

Related U.S. Application Data

(63) Continuation of application No. 09/573,042, filed on May 15, 2000, now abandoned, which is a continuation of application No. 09/274,742, filed on Mar. 23, 1999, now abandoned.

(51) Int. Cl.
*G06F 17/50* (2006.01)

(52) U.S. Cl. .......................................... 703/13; 701/18
(58) Field of Classification Search ............ 703/13–14, 703/18
See application file for complete search history.

(56) References Cited

U.S. PATENT DOCUMENTS 6,128,769 A * 10/2000 Carlson et al. ............... 716/6

* cited by examiner

*Primary Examiner*—Hugh Jones
(74) *Attorney, Agent, or Firm*—Martine Penilla & Gencarella, LLP

(57) ABSTRACT

A method for routing conductors in an integrated circuit design is disclosed, including the steps of determining the number of sensitive conductors requiring placement into quiet track locations, wherein a quiet track location is defined as any track location immediately adjacent to a stable conductor, determining the number of quiet track locations available in said integrated circuit design, and routing one or more sensitive conductors into one or more quiet track locations.

7 Claims, 7 Drawing Sheets

METHODS OF AND APPARATUS FOR ROUTING RANKED CRITICAL CONDUCTORS IN RANKED PREFERRED TRACKS

CROSS REFERENCE TO RELATED APPLICATIONS

This application is a Continuation Application of U.S. patent application Ser. No. 09/573,042, filed May 15, 2000 now abandoned which is a Continuation Application of U.S. patent application Ser. No. 09/274,742, filed Mar. 23, 1999 now abandoned.

BACKGROUND OF THE INVENTION

1. Field of the Invention

The present invention relates to electronic systems utilizing logic signals. More particularly, the present invention provides a method for shielding signal lines which would otherwise inductively or capacitively couple to adjacent conductors.

2. The Background Art

As integrated circuit (IC) designs become more complex, and as those designs utilize higher signal frequencies, there is an increased likelihood of crosstalk between adjacent interconnect lines within one or more functional blocks in an IC.

Typical IC's include large and small functional blocks coupled together by interconnect lines.

FIG. 1 is a block diagram of a prior art IC showing megablocks and interconnect lines.

Referring to FIG. 1, integrated circuit 10 comprises megablocks 12, 14, 16, 18, and 20, each megablock being connected to other megablocks by interconnect lines 22a through 22i provided for that purpose. Each of megablocks 12, 14, 16, 18, and 20 includes logic gates, transistors, and other components. It is common for IC's to include megablocks which have rows of functional circuits, with the circuitry within one or more rows being connected to circuitry in other rows by interconnects which are located in tracks. A track is a location on an integrated circuit die in which an interconnect may be placed, depending on a given design.

FIG. 2 depicts a typical layout of a prior art megablock showing power, ground, and possible track locations.

Referring to FIG. 2, megablock 30 comprises power conductors 32a through 32h provided therein to supply power to columns of bit slices 36a through 36h, and ground conductors 34a through 34h. In a typical megablock, each row such as rows 38 and 40 might have similar functional circuitry throughout each of the bit slices, with the functional circuitry in a given bit slice being connected to circuitry in a different row.

FIG. 3 depicts a prior art bit slice in any given row within a megablock.

Referring to FIG. 3, bit slice 40 comprises power conductor 42, ground conductor 44, dotted lines showing potential track locations 46, 48, and 50, and conductors 52 and 54. In a typical bit slice, there are many more signal paths which connect various functional blocks together in order to perform the intended function. However, only two signal paths are depicted herein in order to avoid needlessly over complicating the disclosure and drawings.

As circuit designs become more complex, and utilize higher and higher signal frequencies, the distance between conductors becomes an increasingly critical factor due to the possibility that signals on one conductor might be inductively or capacitively coupled-to one or more other conductors. For example, conductor 52 is adjacent to conductor 54, making it possible that a signal on conductor 54 might be unintentionally coupled to conductor 52, causing conductor 52 to act in a way which is not intended by the designer.

In order to understand how the prior art routes conductors so that unintended coupling between conductors is minimized, it is necessary to understand how integrated circuits are designed.

Typically, circuitry functionality is modeled in a high-level language such as Verilog. The model is then provided to an analyzer which determines the placement of functional blocks and the routing of circuitry, so that the intended design functions as modeled. Thus, although the designer determines the input and output conditions necessary for proper functionality of a system, the placement of conductors such as conductors 52 and 54 in a single bit slice such as depicted in FIG. 2 is determined using design rules. These design rules include details specifically associated with the manufacturing process which will be used to manufacture the IC.

One element of a design which is controllable, and which also affects the placement of conductors in a bit slice is whether a given signal path requires a "quiet" environment in which to operate. If a given signal path is required to be placed in an environment where inductive and capacitive coupling is minimized, the designer provides that information in the model supplied to the analyzer, and the analyzer takes appropriate action to maximize the coupling of the sensitive conductor to a constant signal source. The appropriate prior art action is to add a new conductor.

For example, in FIG. 4, critical conductor 52 has been placed by the analyzer in the location depicted, immediately adjacent to noisy conductor 54. A critical conductor is a conductor which is sensitive to the adjacent noisy conductor, wherein the adjacent noisy conductor is capable of being inductively coupled or capacitively coupled to the critical conductor. In order to minimize the coupling between conductor 52 and conductor 54, prior art analyzers route a third conductor 60 from a stable conductor, such as ground conductor 44, to a position adjacent to conductor 52.

This technique for routing a constant conductor is known to those of ordinary skill in the art to cause a sensitive conductor to partially couple to the constant conductor, thus minimizing the coupling of the sensitive conductor to the noisy conductor. However, this technique also mandates the use of an available track within a bit slice for the placement of the extra conductor, making the use of that track for other circuitry impossible. In order to provide enough silicon real estate to accomplish this technique in crowded bit slices, it is often necessary to design the wafer to allow for larger bit slices, an undesirable effect.

While the methods used in the prior art are effective for minimizing the inductive and capacitive coupling of noisy signal paths to sensitive signal paths, prior art methods suffer in that significant unnecessary use of silicon real estate results from those methods.

It would therefore be beneficial to provide a method for minimizing coupling of noisy conductors to sensitive conductors which utilizes less silicon real estate than the prior art.

SUMMARY OF THE INVENTION

A method for routing one or more critical conductors in an integrated circuit design is disclosed, including the steps of determining the number of critical conductors requiring placement into preferred track locations, wherein a preferred track location is defined as any track location immediately adjacent to a constant voltage conductor, determining the number of preferred track locations available in said integrated circuit design, and routing one or more critical conductors into one or more preferred track locations.

DETAILED DESCRIPTION OF A PREFERRED EMBODIMENT

Those of ordinary skill in the art will realize that the following description of the present invention is illustrative only and not way any way limiting. Other embodiments of the invention will readily suggest themselves to such skilled persons.

In this disclosure, a constant voltage conductor shall generally refer to a conductor which does not change state. The examples used in this disclosure of constant voltage conductors are power and ground. However, those of ordinary skill in the art will readily recognize that other constant voltage conductors fitting this description exist in the art.

Figure 5:
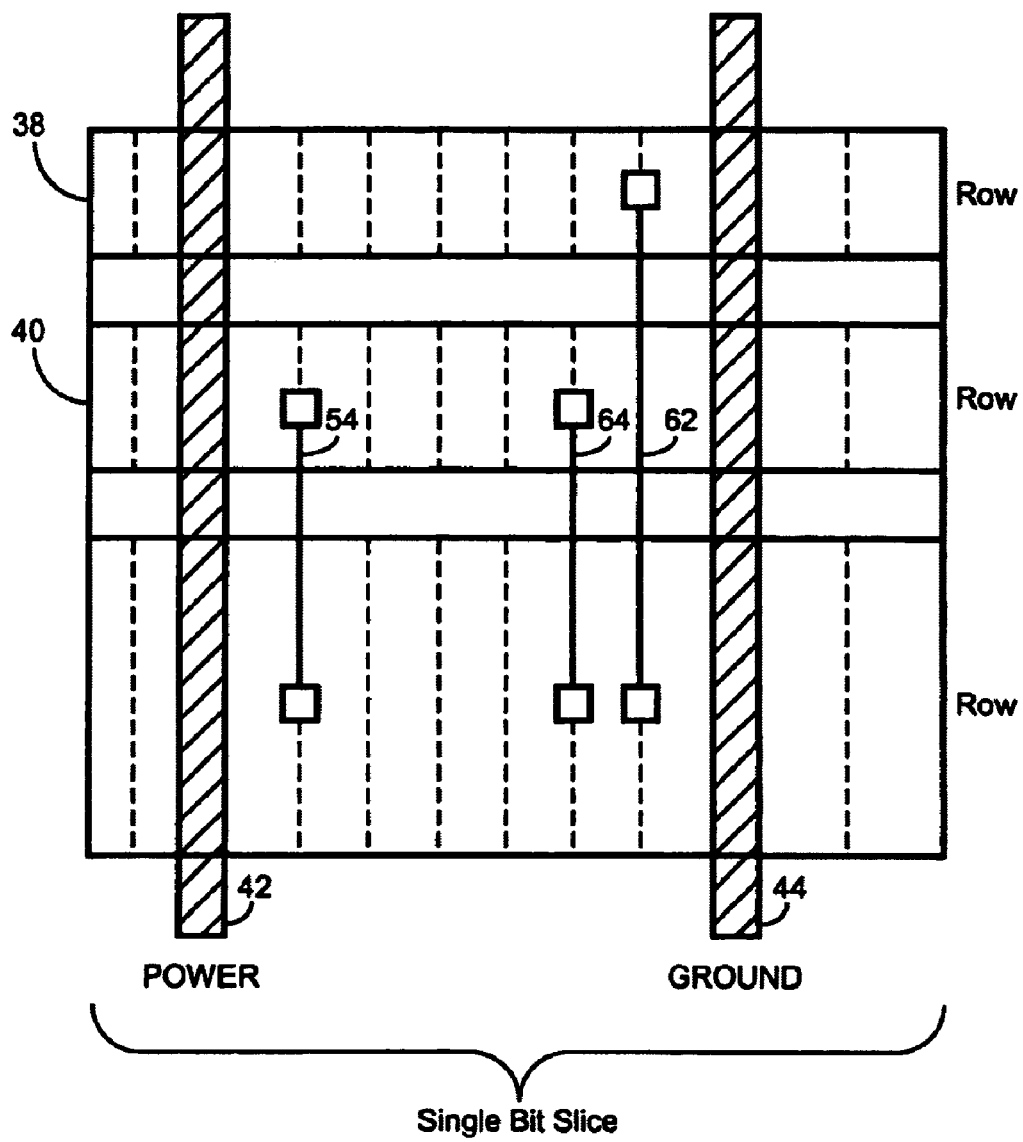
FIG. 5 depicts a present invention bit slice having conductors routed according to one embodiment of the present invention.

FIG. 5 depicts a bit slice having conductors routed according to one embodiment of the present invention.

Figure 1:
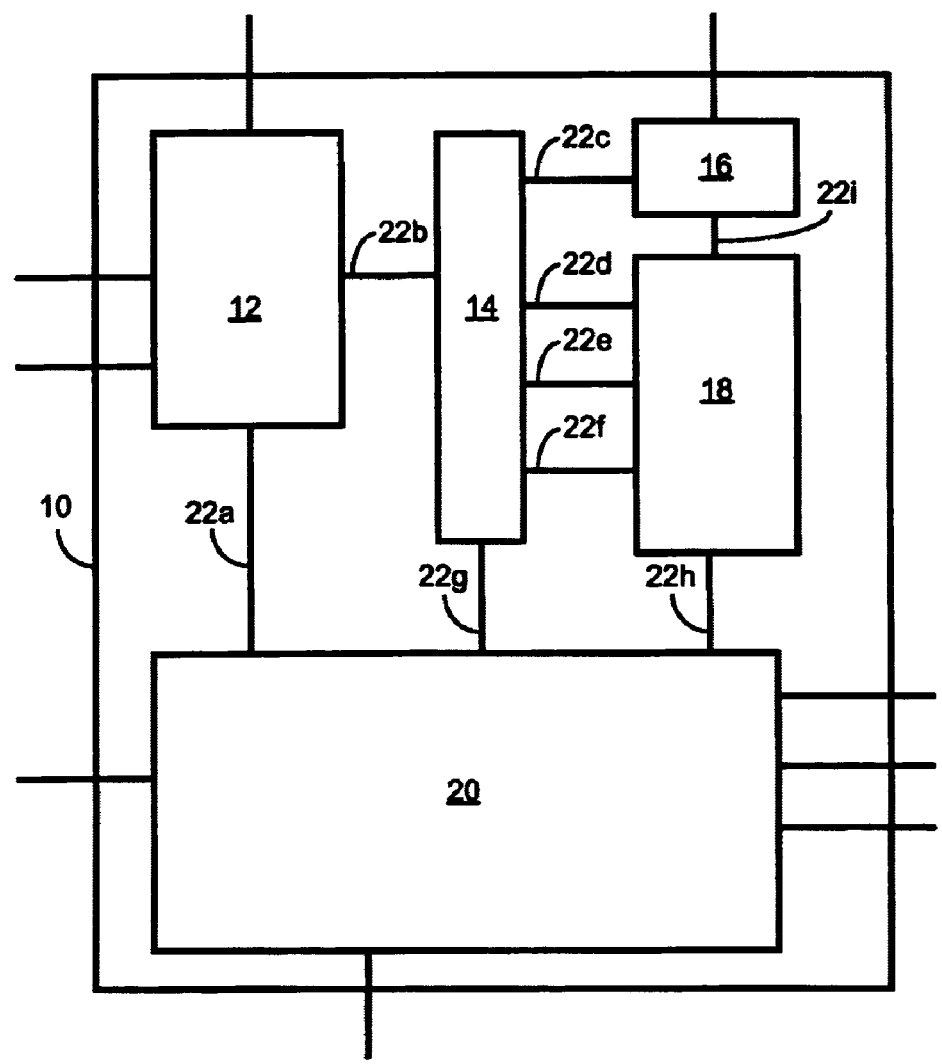
FIG. 1 is a block diagram of a prior art IC showing megablocks and interconnect lines.
Figure 2:
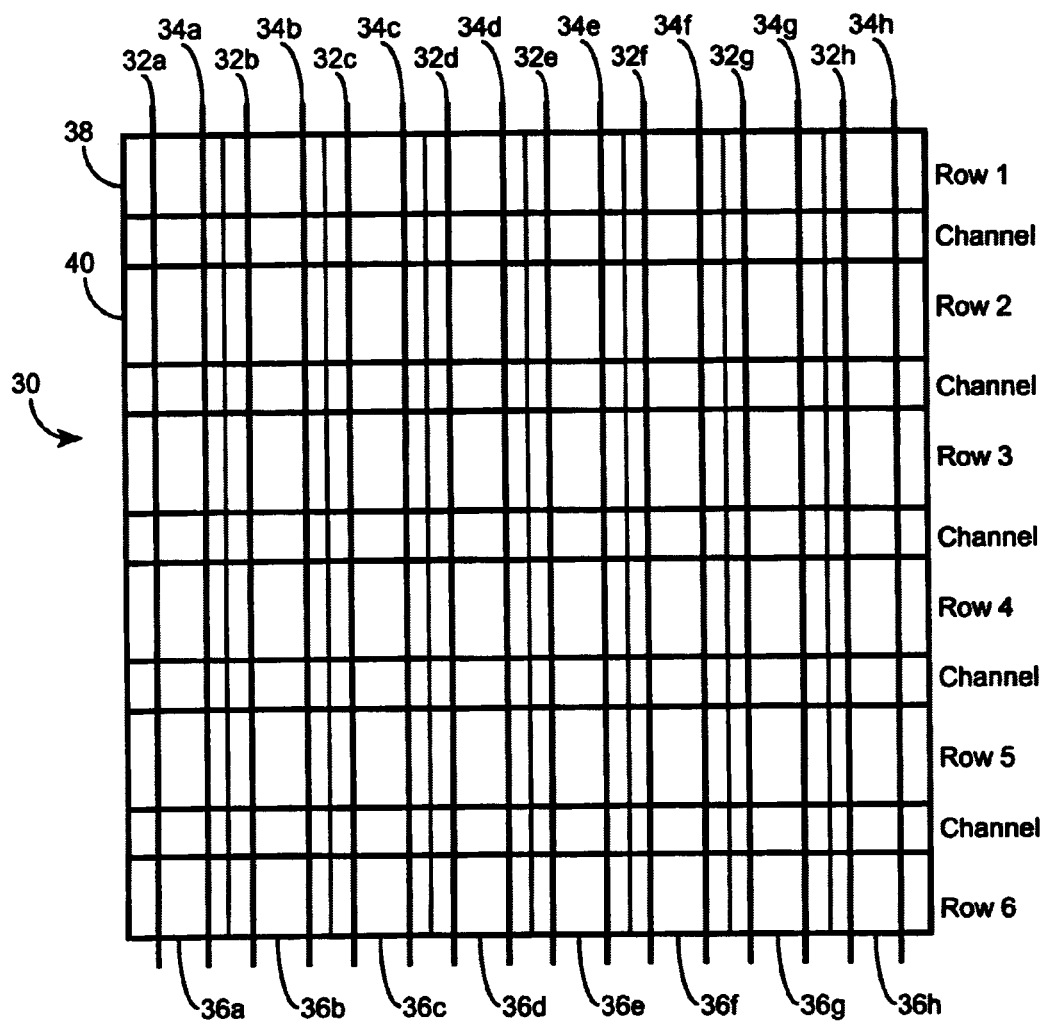
FIG. 2 depicts a typical layout of a prior art megablock showing power, ground, and possible track locations.
Figure 3:
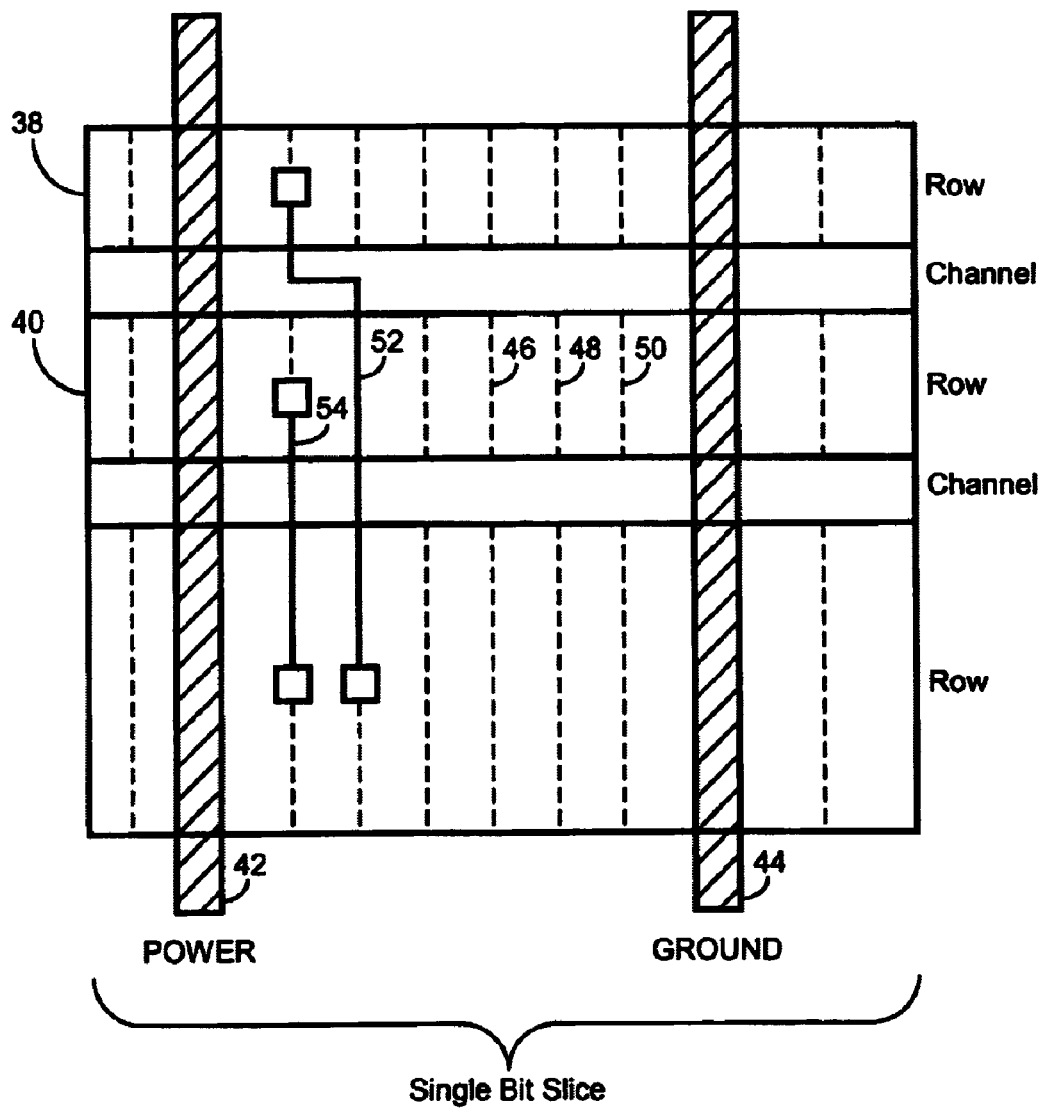
FIG. 3 depicts a prior art bit slice in any given row within a megablock.
Figure 4:
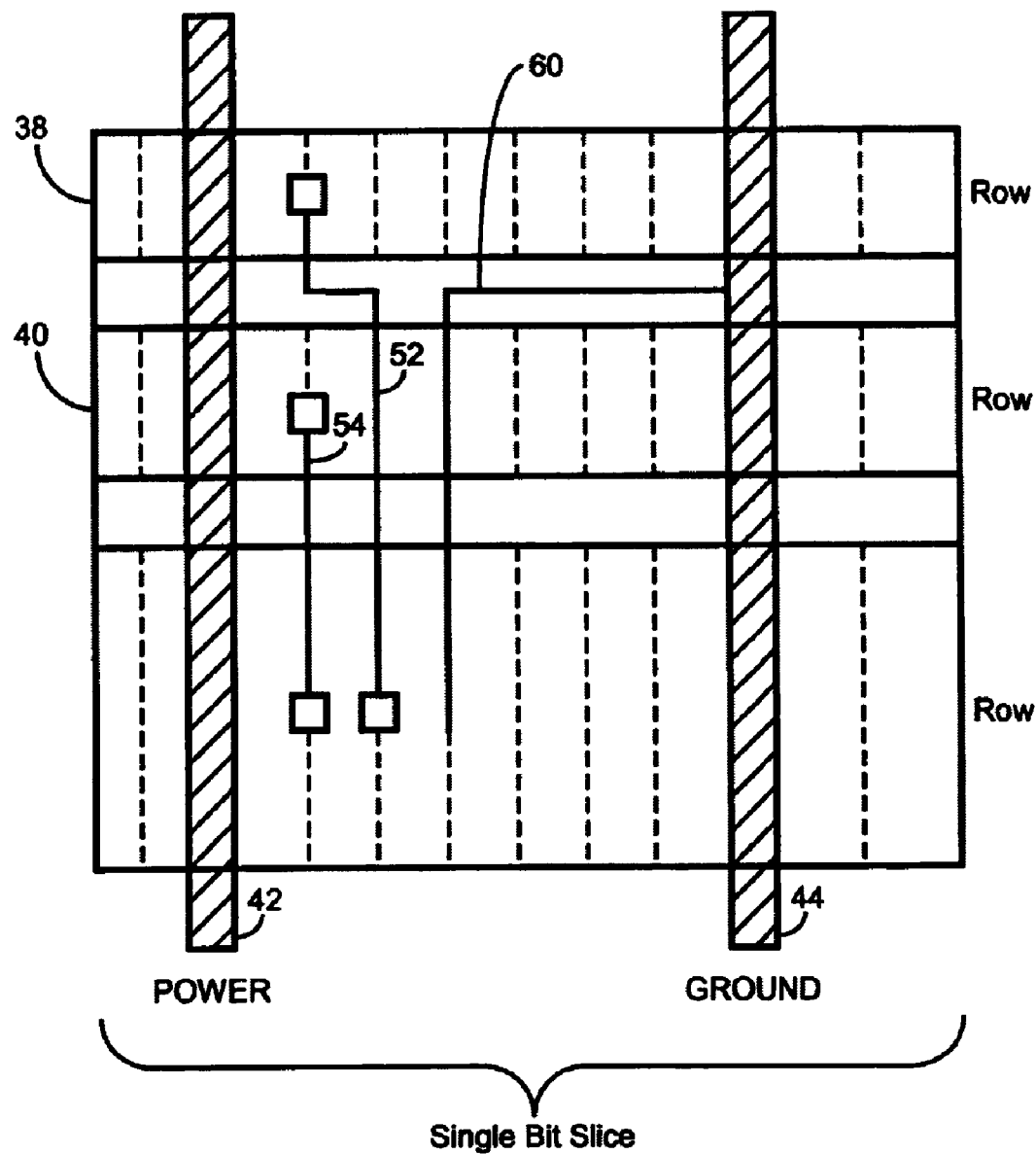
FIG. 4 depicts the prior art bit slice of FIG. 3 further including a quieting conductor.

Referring to FIG. 5, noisy conductor 54 is placed as previously seen in FIG 3. However, critical conductor 62 is a conductor which is sensitive to inductive or capacitive coupling from an adjacent noisy conductor. Noisy conductor 64 although adjacent to conductor 62 does not inductively couple to conductor 62 due to the "quieting" influence on conductor 62 by ground conductor 44.

Because integrated circuits are constructed using multiple metal layers, the quieting influence on a critical conductor by a constant voltage conductor is not restricted to a single metal layer. Therefore, so long as a critical conductor needing a quieting influence is designed to be placed at a track location immediately adjacent to a constant voltage conductor, the effects of the quieting influence of the constant voltage conductor may be felt.

Figure 6:
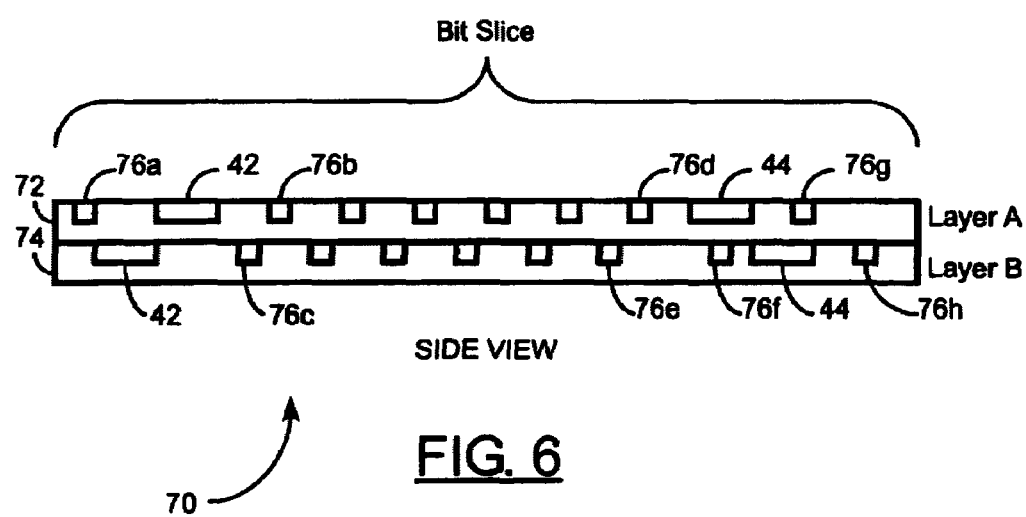
FIG. 6 is a side view of a bit slice of an integrated circuit showing preferred tracks for the placement of critical conductors.

FIG. 6 is a side view of a bit slice of an integrated circuit showing preferred tracks for the placement of critical conductors.

Referring to FIG. 6, bit slice 70 includes two metal layers 72 and 74, with each of layers 72 and 74 including one or more constant voltage conductors, such as a power conductor 42 and a ground conductor 44. According to one embodiment of the present invention, "quiet" locations for the placement of sensitive conductors include tracks 76a through 76h. These tracks are all immediately adjacent to constant voltage.

Tracks such as track 76a, which are immediately adjacent to more than one constant voltage conductor, are considered to be especially quiet, due to the increased coupling to more than one constant voltage conductor. Therefore, tracks 76a, 76c, 76f and 76g are especially quiet, and should be utilized for placement of the most critical conductors, as determined by the IC designer. An IC may have four or more metal layers, providing for potential quiet tracks above, below, left, and right of a given constant voltage conductor.

Figure 7:
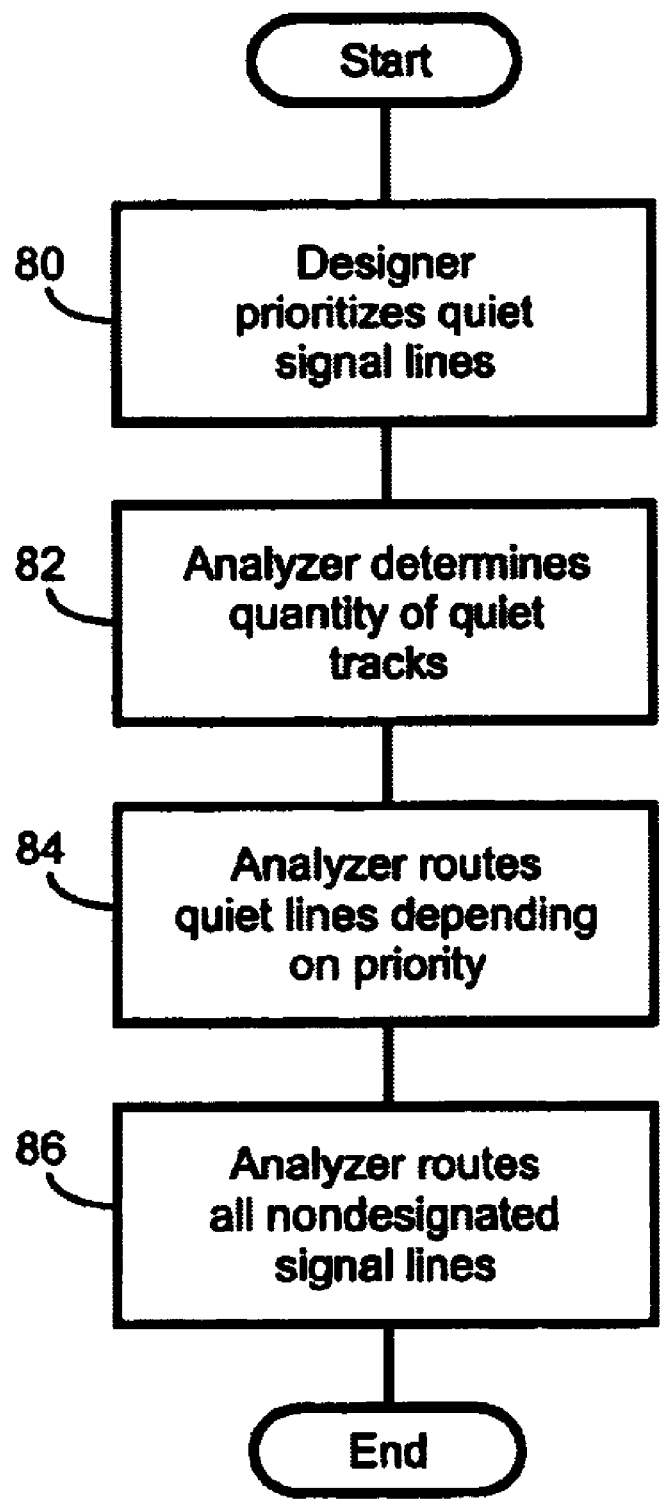
FIG. 7 is a flow chart showing the acts performed by the processes of a method of the present invention.

FIG. 7 is a flow chart showing steps in a method according to the present invention.

Referring to FIG. 7, the method begins at block step 80 wherein the signal conductors which need a quieting influence in which to operate are prioritized. At this step, if a given design is known to have fewer critical lines than preferred tracks to place them, all sensitive conductors may be routed into a preferred location. Alternatively, a designer may rank each critical conductor in order of its importance relative to other sensitive conductors. In this alternative case, conductors are routed according to their rank, thus ensuring that the more highly ranked conductors are placed in quiet track locations.

At block 82, it is determined how many preferred tracks exist in the present design. At this step, the analyzer may alternatively rank the preferred tracks, ranking the tracks which are immediately adjacent to two constant voltage conductors higher than tracks which are immediately adjacent to a single constant voltage conductor.

At block 84, the analyzer routes critical conductors into tracks previously designated at step 82. If, at step 80, the designer had ranked sensitive conductors according to the desirability of placing them in a constant voltage location, the analyzer routes the higher ranked conductors first. If, at step 82, the analyzer had ranked the preferred tracks according to whether any given preferred track had one, two, or more adjacent constant voltage conductors, the analyzer, at step 84, places the most highly ranked critical conductor at the most preferred location. The analyzer then places the next highest ranked critical conductor at the next most preferred track location, and so on, until all ranked conductors have been placed.

At block 86, the analyzer routes any conductors not already routed into the remaining track locations.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for routing a plurality of critical conductors in an integrated circuit design, the method comprising the operations of:

identifying a plurality of logic signals which are to be communicated by the critical conductors;

prioritizing the plurality of critical conductors by ranking the critical conductors in order of the importance of the critical conductors relative to each other, the importance being with respect to the needs of the critical conductors to be protected from inductive coupling or capacitive coupling from at least one adjacent conductor;

providing a plurality of preferred tracks, each track being configured to be located adjacent to at least one constant voltage conductor;

prioritizing the plurality of preferred tracks by ranking the preferred tracks in order of which preferred track is immediately adjacent to the most constant voltage conductors; and routing the critical conductors into the preferred tracks according to the rankings of both the critical conductors and the preferred tracks starting with the critical conductor having the highest critical conductor rank being first routed into the preferred track having the highest preferred track rank.

2. A computer system for routing conductors in an integrated circuit design, the computer system comprising:

a processor; and a memory operatively coupled to said processor, the memory having stored therein instructions for performing the following operations:

identifying a plurality of the conductors to be connected in an integrated circuit configured with the design by being placed into tracks having various locations relative to constant voltage conductors wherein preferred tracks are located immediately adjacent to one or more of the constant voltage conductors, the conductors comprising critical conductors that are sensitive to inductive coupling or capacitive coupling from at least one adjacent conductor;

ranking each of the preferred tracks with respect to all of the other preferred tracks in an order based on which preferred track is immediately adjacent to the most constant voltage conductors;

ranking each of the critical conductors with respect to all of the other critical conductors in an order based on the importance of protecting each particular critical conductor from inductive coupling or capacitive coupling from at least one adjacent conductor; and routing the critical conductors into the preferred tracks according to the rankings of both the critical conductors and the preferred tracks, the routing starting with the critical conductor having the highest critical conductor rank being first routed into the preferred track having the highest preferred track rank.

3. A computer system as recited in claim 2, wherein the routing operation first routes the critical conductor having the highest critical conductor rank into the preferred track that is located immediately adjacent to more constant voltage conductors than are immediately adjacent to any of the other preferred tracks.

4. A computer system as recited in claim 2, the memory further having stored therein instructions for performing the following operation:

continuing the routing of the critical conductors into the preferred tracks according to the rankings of both critical conductors remaining in the critical conductor ranking and preferred tracks remaining in the preferred track ranking, the routing starting with the next critical conductor having the next highest critical conductor rank being next routed into the preferred track having the next highest preferred track rank.

5. A computer program product embodied on a computer-readable medium and comprising code that, when executed by the computer, causes the computer to perform the following for routing conductors in an integrated circuit design:

identifying a plurality of the conductors to be connected in an integrated circuit configured with the design by being placed into tracks, the tracks having various locations relative to constant voltage conductors, preferred ones of the tracks being located immediately adjacent to one or more of the constant voltage conductors, the conductors comprising critical conductors that are sensitive to inductive coupling or capacitive coupling from at least one adjacent conductor;

ranking each of the preferred tracks with respect to all of the other preferred tracks in an order based on which preferred track is immediately adjacent to the most constant voltage conductors;

ranking each of the critical conductors with respect to all of the other critical conductors in an order based on the importance of protecting each particular critical conductor from inductive coupling or capacitive coupling from at least one adjacent conductor; and routing the critical conductors into the preferred tracks according to the rankings of both the critical conductors and the preferred tracks, the routing starting with the critical conductor having the highest critical conductor rank being first routed into the preferred track having the highest preferred track rank.

6. A computer program product embodied on a computer-readable medium as recited in claim 5, wherein the code, when executed by the computer, causes the computer to further perform the following:

continuing the routing of the critical conductors into the preferred tracks according to the rankings of both critical conductors remaining in the critical conductor ranking and preferred tracks remaining in the preferred track ranking, the routing starting with the next critical conductor having the next highest critical conductor rank being next routed into the preferred track having the next highest preferred track rank.

7. A computer program product embodied on a computer-readable medium as recited in claim 6, wherein the code, when executed by the computer, causes the computer to further perform the following:

continuing the continuing routing until either all of the critical conductors have been routed into one of the preferred tracks according to the rankings of both critical conductors remaining in the critical conductor ranking and preferred tracks remaining in the preferred track ranking, or there are no more preferred tracks in the ranking of preferred tracks.

* * * * *